US010689532B2

(12) United States Patent
Gaudl et al.

(10) Patent No.: US 10,689,532 B2
(45) Date of Patent: Jun. 23, 2020

(54) RADIATION CURABLE HYBRID INKS

(71) Applicant: SUN CHEMICAL CORPORATION, Parsippany, NJ (US)

(72) Inventors: Kai-Uwe Gaudl, Bavaria (DE); Juanita Parris, Montvale, NJ (US)

(73) Assignee: Sun Chemical Corporation, Parsippany, NJ (US)

( * ) Notice: Subject to any disclaimer, the term of this patent is extended or adjusted under 35 U.S.C. 154(b) by 0 days.

(21) Appl. No.: 15/756,254

(22) PCT Filed: Aug. 29, 2016

(86) PCT No.: PCT/US2016/049235
§ 371 (c)(1),
(2) Date: Feb. 28, 2018

(87) PCT Pub. No.: WO2017/044334
PCT Pub. Date: Mar. 16, 2017

(65) Prior Publication Data
US 2019/0023916 A1    Jan. 24, 2019

Related U.S. Application Data

(60) Provisional application No. 62/217,258, filed on Sep. 11, 2015.

(51) Int. Cl.
*C09D 11/101* (2014.01)
*C09D 11/06* (2006.01)
(Continued)

(52) U.S. Cl.
CPC .......... *C09D 11/101* (2013.01); *C08L 71/02* (2013.01); *C09D 11/00* (2013.01); *C09D 11/02* (2013.01);
(Continued)

(58) Field of Classification Search
CPC .......................... C09D 11/38; C09D 11/322
See application file for complete search history.

(56) References Cited

U.S. PATENT DOCUMENTS 5,212,213 A * 5/1993 Hutter ................ C08F 8/46
522/104
5,543,219 A * 8/1996 Elwakil ........... C09B 67/0004
106/31.64
(Continued)

FOREIGN PATENT DOCUMENTS

WO    WO 2015/023428 A1    2/2015

OTHER PUBLICATIONS

International Preliminary Report on Patentability issued in International Application No. PCT/US2016/049235, dated Mar. 13, 2018.
(Continued)

*Primary Examiner* — Helene Klemanski
(74) *Attorney, Agent, or Firm* — Charles C. Achkar; Ostrolenk Faber LLP.

(57) ABSTRACT

The present invention provides radiation curable hybrid ink and coating compositions comprising large amounts of inert hard resin. The radiation hybrid ink and coating compositions have good lithographic properties, low roller swelling, and a low gloss-back effect when overprinted with a UV varnish. The ink and coating compositions are useful for lithographic wet and waterless printing.

21 Claims, 2 Drawing Sheets

(51) Int. Cl.
| | |
|---|---|
| C09D 11/08 | (2006.01) |
| C09D 11/105 | (2014.01) |
| C09D 11/108 | (2014.01) |
| G03F 7/031 | (2006.01) |
| G03F 7/032 | (2006.01) |
| C08L 71/02 | (2006.01) |
| G03F 7/027 | (2006.01) |
| G03F 7/004 | (2006.01) |
| C09D 11/02 | (2014.01) |
| C09D 11/00 | (2014.01) |
| C09D 125/16 | (2006.01) |
| C09D 133/08 | (2006.01) |
| C09D 193/04 | (2006.01) |
| C08G 65/18 | (2006.01) |
| C08G 65/16 | (2006.01) |
| C09D 171/02 | (2006.01) |
| C08K 3/34 | (2006.01) |
| C08K 3/36 | (2006.01) |
| C08K 5/07 | (2006.01) |
| C08K 3/26 | (2006.01) |

(52) U.S. Cl.
CPC ............ *C09D 11/06* (2013.01); *C09D 11/08* (2013.01); *C09D 11/105* (2013.01); *C09D 11/108* (2013.01); *C09D 125/16* (2013.01); *C09D 133/08* (2013.01); *C09D 193/04* (2013.01); *G03F 7/0047* (2013.01); *G03F 7/027* (2013.01); *G03F 7/031* (2013.01); *G03F 7/032* (2013.01); *C08G 65/16* (2013.01); *C08G 65/18* (2013.01); *C08K 3/346* (2013.01); *C08K 3/36* (2013.01); *C08K 5/07* (2013.01); *C08K 2003/265* (2013.01); *C08K 2003/267* (2013.01); *C09D 171/02* (2013.01)

(56) References Cited

U.S. PATENT DOCUMENTS

| | | |
|---|---|---|
| 5,811,481 A | 9/1998 | Boutier et al. |
| 2003/0054103 A1* | 3/2003 | Sato ................. C08F 257/02 427/256 |
| 2004/0210029 A1 | 10/2004 | Fontane |
| 2005/0245630 A1 | 11/2005 | Narayan-Sarathy et al. |
| 2011/0053082 A1 | 3/2011 | Ichikawa et al. |

OTHER PUBLICATIONS

Anthony Bean, "Hybrid Sheetfed lithographic systems—State of the Art," Radtech report 2009.
Paul Gaevert, "Ink performance properties of UV, conventional and hybrid sheet-fed inks," Radtech Conference Nov. 3-5, 2003, Conference Proceedings.
Tony Bean, "Hybrid Ink Technology, " Radtech report 2005.
Dieter Kleeberg in "Quality enhancement with hybrid production" in Process 2006 (publication of press maker KBA).
International Search Report issued in International Application No. PCT/US16/49235, dated Nov. 10, 2016.
Written Opinion of the International Searching Authority issued in International Application No. PCT/US16/49235, dated Nov. 10, 2016.

* cited by examiner

RADIATION CURABLE HYBRID INKS

CROSS-REFERENCE TO RELATED APPLICATIONS

The present application is a § 371 National Phase application based on PCT/US2016/049235 filed Aug. 29, 2016, which claims the benefit of U.S. Provisional Application No. 62/217,258, filed Sep. 11, 2015 the subject matter of each of which is incorporated by reference in their entirety.

FIELD OF THE INVENTION

The present invention relates to radiation curable hybrid inks and coatings comprising energy curable monomers and/or oligomers, as well as raw materials used in conventional offset inks, such as oils, alkyd resins, and hard resins. The radiation curable hybrid inks and coatings are suitable for application by lithographic printing.

BACKGROUND

Conventional inks for lithographic printing are formulated with vegetable or mineral oils, alkyd resins, and phenolic resins or hydrocarbon resins. On porous substrates, such as paper or board, low viscosity, low aromatic mineral oils are used. The mineral oils penetrate into the substrate to induce physical drying, or setting ("quick set" effect). However, the quick set effect cannot be employed when printing on non-porous substrates, such as plastic films. For printing on non-porous substrates, inks are formulated using vegetable oils and their esters (known as drying oils), to dissolve the hard resin and for reducing viscosity. The oils in lithographic inks participate in the drying of the inks by an oxidation reaction.

A major disadvantage of conventional lithographic inks is the slow drying speed. Conventional lithographic inks based on oils and alkyds dry slowly by penetration of the substrate (setting), and oxidation. This is especially critical for non-porous substrates where an oil does not penetrate. This negatively impacts the productivity a converter can achieve. Thus, a need exists for producing faster drying inks to improve productivity.

Energy curable inks have also been employed in lithographic printing. Energy curable inks have improved gloss and resistance properties. However, there are drawbacks to using energy curable inks for lithographic printing. For example, pigment wetting of energy curable inks is not as good as for conventional inks, resulting in print density problems and the like. In addition, energy curable inks show problems with low shear viscosity, less stable emulsion with water, and higher tack. The lack of stability in an emulsion with water results in a smaller water balance on the printing press. Higher tack may lead to picking of fibers or coating when printing on paper or board.

Depending on the requirements of a particular print job, a converter may want to use both conventional and energy curable lithographic inks. Conventional inks are generally printed with N-buna-nitrile rubber (NBR) rollers, while energy curable inks are generally printed with ethylene-propylene-diene-monomer (EPDM) rollers. Energy curable inks are not compatible with NBR rollers, and conventional inks are not compatible with EPDM rollers. Use of an incompatible ink leads to roller swelling, thus compromising print quality. To employ both conventional and energy curable inks on the same press, a converter must switch rubber rollers and blankets on the printing press.

Often, to improve gloss of prints made with conventional inks, a converter will apply an energy curable topcoat over the printed substrate. But, the energy curable topcoat is not compatible with the oil and alkyd based inks, and you often get "gloss back". Gloss back is the phenomenon where a radiation curable coating applied over a conventional ink loses gloss within a short period after cure, typically within a day. To improve gloss back, it is generally necessary to apply a water-based primer between the print and the energy curable topcoat.

In an attempt to overcome these problems, there has been an effort to develop "hybrid" inks which comprise both conventional ink components and energy curable components. Hybrid inks are described by Paul Gaevert at Radtech Conference Nov. 3-5, 2003, Conference Proceedings "Ink performance properties of UV, conventional and hybrid sheet-fed inks;" Tony Bean in "Radtech Report Oct. 2009, Hybrid Sheetfed lithographic systems—State of the Art;" and Dieter Kleeberg in "Quality enhancement with hybrid production" in Process 2006 (publication of press maker KBA).

Radiation curable hybrid inks are radiation curable inks which also contain raw materials from conventional inks, such as oils, alkyd resins, and hard resins. Hybrid inks combine different drying properties. They preferably dry under UV (ultraviolet) or EB (electron beam) radiation, and also dry by oxidation by air or heat drying. Moreover, the inks can dry by penetration of the oils into the substrate like in oil-based conventional inks. One advantage that may be observed with hybrid inks is that they can be directly overprinted with a radiation curable coating with only minor loss in gloss (i.e. minor gloss back). Consequently, an aqueous primer between ink and coating, as well as a double coater on press, can be spared.

However, because radiation curable hybrid inks are based on chemically different materials, such as non-polar vegetable oils or minerals, and phenolic or hydrocarbon resins, in combination with the more polar monomeric acrylates and resins, good compatibility is not easy to achieve.

One drawback of hybrid inks is that the stability of the hybrid ink has to be balanced. In the presence of oxygen, the oil-based materials can start to build up viscosity by oxidation, especially in the presence of a dryer, whereas, on the other hand, oxygen stabilizes radiation curable components such as acrylates.

The major disadvantage of currently available hybrid inks is due to the incorporation of oils and alkyds, which dry slowly by penetration (setting) and oxidation, adversely affecting the drying speed of the entire ink. As the determining factor for ink drying is now the setting of the oil and the oxidation of the alkyd, a converter is usually not getting the productivity (line speed) of a 100% radiation curable ink. This is especially critical for non-porous substrates where an oil does not penetrate.

It can therefore be seen that the demands required from the formulation of hybrid inks is enormously complex, and optimizing the properties of inks is equally complex. From a lithographic standpoint, it is advantageous to have an ink with a high amount of oils, alkyds, and hard resin. Conversely, in view of drying speed, productivity and gloss back, a high amount of radiation curable monomers and oligomers is favorable.

SUMMARY OF THE INVENTION

The present invention solves the problems related to use of hybrid inks by developing a balanced radiation curable hybrid ink containing a limited amount of conventional oils and alkyds, but a high amount of inert hard resin. The resultant ink shows good lithographic properties and can be overprinted with a UV varnish with only minor gloss back, and good intercoat adhesion. The inventive hybrid inks exhibit good lithographic properties vs 100% radiation curable inks due to better pigment wetting of alkyds and conventional resins vs acrylate monomers and oligomers. The higher amount of conventional, acrylate compatible inert hard resins vs. oil and alkyds helps to reduce cure retardation and increase compatibility with acrylates.

In a particular aspect, the present invention provides a lithographic radiation hybrid ink or coating composition comprising:
 a) 10 wt % to 30 wt % one or more inert hard resins selected from the group consisting of rosin resins, rosin resin derivatives, hydrocarbon resins, modified hydrocarbon resins, and combinations thereof; and
 b) 5 wt % to 45 wt % one or more multifunctional acrylate monomers.

The present invention also provides a method of printing an article comprising applying the lithographic radiation curable hybrid ink of the invention as a UV-coldset lithographic ink, or as a UV-heatset lithographic ink.

The present invention further provides a printed article comprising the energy curable hybrid lithographic ink of the invention.

DETAILED DESCRIPTION OF THE INVENTION

Figure 1:
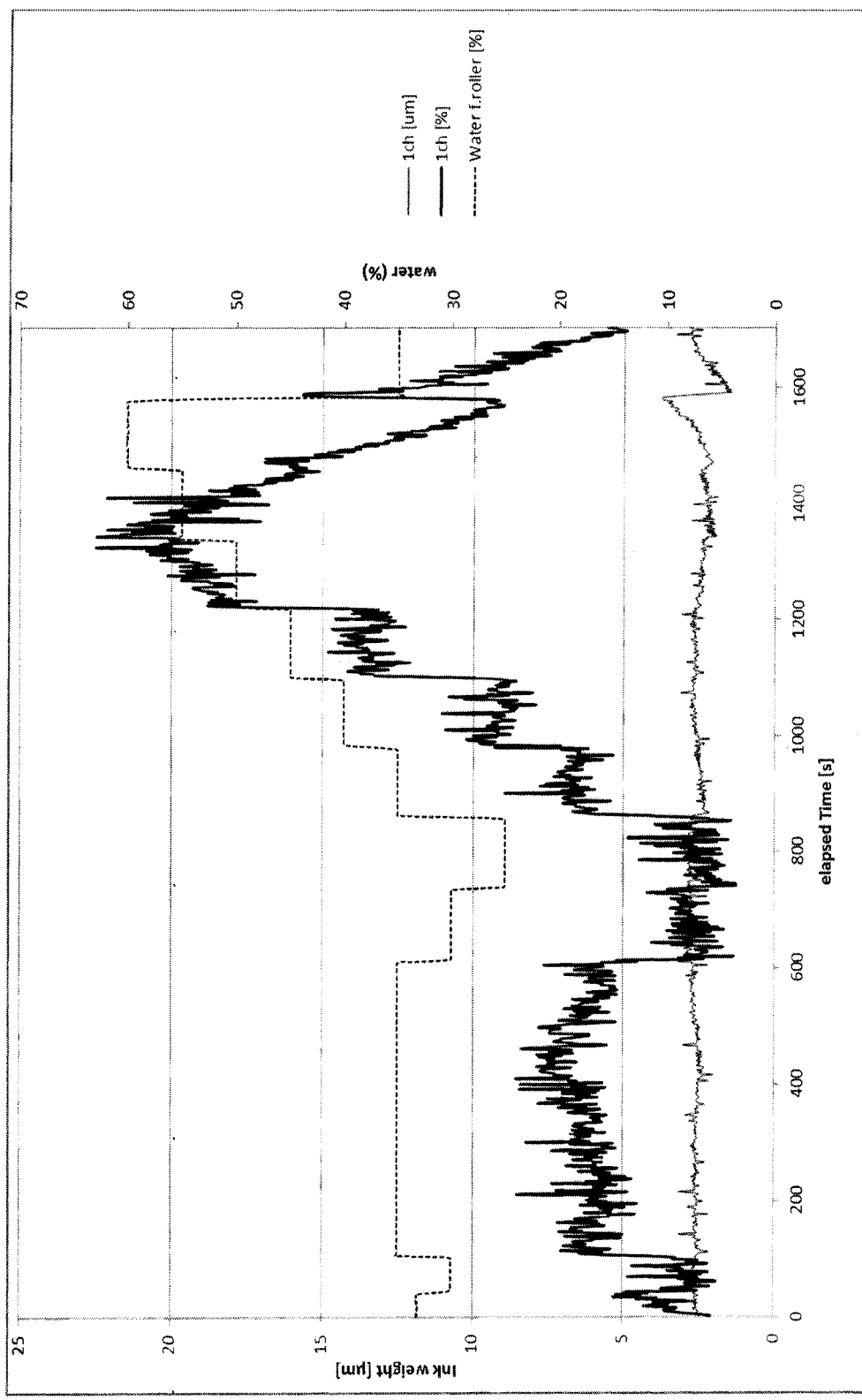
FIG. 1 shows the visualized ink film thickness (1-ch thin line) of the ink of Example 1, measured with a sensor next to the printing plate during reduction and increase of water settings on the offset print simulator. The stable thin line (1ch) indicates a robust lithography.

It is to be understood that the foregoing general description and the following detailed description are exemplary and explanatory only, and are not restrictive of any subject matter claimed.

Unless otherwise defined, all technical and scientific terms used herein have the same meaning as is commonly understood by one of skill in the art to which the inventions belong. All patents, patent applications, published applications and publications, websites and other published materials referred to throughout the entire disclosure herein, unless noted otherwise, are incorporated by reference in their entirety for any purpose.

The present invention provides radiation curable hybrid inks and coatings, having good lithographic properties, low EPDM roller swelling and a low gloss-back effect when overprinted with a UV-varnish. The inks are useful for lithographic wet and waterless printing.

Definitions

In this application, the use of the singular includes the plural unless specifically stated otherwise. As used herein, the singular forms "a," "an" and "the" are intended to include the plural forms as well, unless the context clearly indicates otherwise.

In this application, the use of "or" means "and/or" unless stated otherwise. As used herein, the terms "comprises" and/or "comprising" specify the presence of the stated features, integers, steps, operations, elements, and/or components, but do not preclude the presence or addition of one or more other features, integers, steps, operations, elements, components, and/or groups thereof. Furthermore, to the extent that the terms "includes," "having," "has," "with," "composed," "comprised" or variants thereof are used in either the detailed description or the claims, such terms are intended to be inclusive in a manner similar to the term "comprising."

As used herein, the term "(meth)acrylate" refers to both acrylate and methacrylate compounds. When the term "acrylate" is used alone, it is understood that it encompasses both acrylate and methacrylate compounds.

As used herein, an "energy curable" or "radiation curable" ink or coating composition is a composition that can be cured by any suitable source of actinic radiation. Suitable sources of UV radiation include, but are not limited to, a high-voltage mercury bulb, a medium-voltage mercury bulb, a xenon bulb, a carbon arc lamp, a metal halide bulb, iron-doped lamps, a UV-LED lamp or sunlight. Other sources of radiation include, but are not limited to, microwave, infrared, electron beam, visible light, x-ray, laser, and the like.

As used herein, a "radiation curable hybrid ink" or "energy curable hybrid ink" is an ink or coating composition which contains energy curable components (for example, but not limited to, acrylate monomers), and also contains raw materials from conventional inks, such as, but not limited to, oils, alkyd resins, and hard resins.

As used herein, the term "article" or "articles" means a substrate or product of manufacture. Examples of articles include, but are not limited to: substrates such as paper, plastic, plastic or polymer film, glass, ceramic, metal, composites, and the like; and products of manufacture such as publications (e.g. brochures), labels, and packaging materials (e.g. cardboard sheet or corrugated board), containers (e.g. bottles, cans), a polyolefin (e.g. polyethylene or polypropylene), a polyester (e.g. polyethylene terephthalate), a metalized foil (e.g. laminated aluminum foil), metalized polyester, a metal container, and the like.

As used herein, the terms "ink," "inks," "coating," "coatings," "ink and coating," and "inks and coatings" are used interchangeably.

As used herein, ranges and amounts can be expressed as "about" a particular value or range. "About" is intended to also include the exact amount. Hence "about 5 percent" means "about 5 percent" and also "5 percent." "About" means within typical experimental error for the application or purpose intended.

Throughout this disclosure, all parts and percentages are by weight (wt % or mass % based on the total weight) and all temperatures are in ° C. unless otherwise indicated.

Radiation Curable Hybrid Inks and Coatings

The present application provides energy curable hybrid inks and coatings suitable for lithographic printing. The inks and coatings of the invention are balanced radiation curable hybrid inks and coatings containing a limited amount of conventional oils and alkyds, but a high amount of inert hard resin. The resultant inks and coatings show good lithographic properties and can be overprinted with a UV varnish, with only minor gloss back, and good intercoat adhesion. The inventive hybrid inks exhibit good lithographic properties vs 100% radiation curable inks due to better pigment wetting of alkyds and conventional resins vs acrylate monomers and oligomers. The inventive hybrid inks also provide faster drying and curing, increasing productivity, due to the inclusion of energy curable monomers. The higher amount of conventional, acrylate compatible inert hard resins vs. oil and alkyds helps to reduce cure retardation and increase compatibility with acrylates.

In a particular aspect, the present invention provides a lithographic radiation curable hybrid ink or coating composition comprising:
a) 10 wt % to 30 wt % one or more inert hard resins selected from the group consisting of rosin resins, rosin resin derivatives, hydrocarbon resins, modified hydrocarbon resins, and combinations thereof; and
b) 5 wt % to 45 wt % one or more multifunctional acrylate monomers.

The present invention also provides a method of printing an article comprising applying the lithographic radiation curable hybrid ink of the invention as a UV-coldset lithographic ink, or as a UV-heatset lithographic ink.

The present invention further provides a printed article comprising the energy curable hybrid lithographic ink of the invention.

Typical hybrid inks as described in the literature contain a large amount of radiation curable materials, but only a smaller amount of oils and alkyds.

The formulation of a typical radiation curable hybrid ink is given in the proceedings of Radtech conference (Paul Geavert, Radtech Europe 2003), where the materials of conventional inks (oils and alkyds) are limited to 15%. In general, typical radiation curable hybrid inks contain about 5-15% vegetable oils and alkyd resins, about 0-15% polyester acrylates, about 0-10% epoxy acrylates, about 0-50% vegetable oil acrylates, about 5-15% acrylic monomers, about 14-24% pigments, about 4-8% fillers, about 4-8% photoinitiators, and about less than 1% stabilizers and inhibitors. This is also confirmed in a review article ("Hybrid Sheetfed lithographic systems—State of the Art", Tony Bean, Radtech report 2009), that the typical hybrid inks contain only a smaller amount of conventional raw materials.

The above mentioned formulation ranges show slower curing speed (lower reactivity), lower solvent resistance due to the non-reactive inert oils and alkyds, but on the other hand due to the limited amount of conventional materials, exhibit a very similar lithography compared to a typical UV ink. The lithographic performance of typical UV inks is inferior to conventional inks using non-reactive inert oils and alkyds.

Thus, the only advantage that remains is that typical radiation curable hybrid inks can be run both on rollers for radiation curable inks as well as conventional inks, but the target of getting a substantially better lithography is not achieved.

Applicants have now unexpectedly observed that with the introduction of high amounts of inert hard resin, such as maleic rosin resin, or an aromatic hydrocarbon resin, the total amount of conventional ink ingredients in a hybrid ink can be considerably increased, which favors lithography, while minimally affecting drying speed.

Preferred are maleic rosin resins which are soluble in acrylic monomers. Suitable maleic rosin resins include, but are not limited to, Jonrez IM 816, Jonrez IM 817, Jonrez IM 824, Jonrez IM 833 (all from Westvaco), Arez RE 3010 (AREZ International), Resinall's 440 and 445, Filtrez 3300 (AKZO). The preferred resins have a softening point >100° C., a cloud point >100° C. at a concentration of 10% by weight in a test oil with a boiling point of 260° C. to 290° C. (for example PKWF 6/9 test oil from Haberman Company or Dow Chemical Company), and an acid value of 10-40 mg KOH/g. Cloud point of a resin (also known as precipitation temperature) is an assessment of the compatibility of lithographic ink resins with a high boiling point solvent, such as petroleum distillates (oils). The closer the cloud point of the resin to the cloud point of the solvent, the more compatible, or soluble, the resin is with the solvent. Rosin resins and hydrocarbon resins with a cloud point of >100° C. in this test are generally more compatible/soluble with acrylates. Thus, resins with a cloud point of >100° C. are more suitable for use in the energy curable hybrid inks and coatings of the invention.

Preferred is also an aromatic $C_9$ hydrocarbon resins having a softening point of >100° C., such as Norsolene 5125, 5135, 5145 (all from Cray Valley) or GA-120, a $C_9$ aromatic hydrocarbon resin (Luen Liang Industrial, Taiwan) and mixtures thereof.

Though not bound by any specific theory, applicants believe that the inert hard resin, even when present in large amounts, becomes immediately hard and solid once the radiation curable acrylate matrix is dried, so that the drying properties (line speed) is less affected.

Moreover, a second matter to improve radiation cure is to partly replace or limit the often proposed vegetable oil acrylates, which are known for sluggish radiation cure, by a very reactive multifunctional acrylate, such as trimethylol propane triacrylate, or di-trimethylol propane triacrylate, or propoxylated glycerol triacrylate.

Unlike the common belief that for compatibility reasons an oil-modified acrylate has to be used in hybrid inks in order to be compatible with the conventional oils and alkyds, applicants found that many common multifunctional acrylates such as trimethylol propane triacrylate or di-trimethylol propane triacrylate or propoxylated glycerol triacrylate can be used to a large extent. However, it is more difficult to include highly ethoxylated acrylic monomers in large amounts, which can cause some incompatibility due to their polarity. While it is possible to use monofunctional acrylate(s) in the hybrid inks of the present invention, it is preferred that these materials be used at a maximum of 10%, more preferably a maximum of 5%. Proposed amounts of materials for a hybrid ink of the present invention are: oils and alkyds 0-25%; inert hard resin >10%, preferably 10-30% or 13-30%; acrylate oligomer 0-20%; acrylate monomer 5-35%; colorant (pigment or dye) 0-40%; extenders and fillers 0-10%; photoinitiators 0-10%; and additives 0-4%.

The preferred total amount of oils, alkyds and inert hard resin is >10%, more preferably >20%, more preferably >30%, more preferably >40%, more preferably >50%. The preferred amount of inert hard resin is >10%, more preferably >13%.

The precise formulation will also depend on the targeted ink properties.

Typically, radiation curable hybrid inks of the present invention show a viscosity of about 5-100 Pa·s at a shear rate of D=50 l/s. Preferred is a viscosity of about 20-60 Pa·s. The flow of the radiation curable hybrid inks of the invention is also measured. Typical values for flow, as measured using the inclined plane test (e.g. an inclined aluminum plate) at an incline of 90° and with 1 ml of ink are about 3-15 cm after 15 minutes.

The inks of the present invention preferably show a tack of 150-350 units measured using a "tack-o scope" instrument (Model 2001) from IGT testing systems, Netherlands, which is known to a person skilled in the art. The more preferred tack is about <250 units. Tack affects print quality. If tack is too high, there may be damage to a substrate such as paper, known as "picking," where fibers of the paper substrate are pulled onto the ink blanket. Tack that is too low can lead to problems such as inadequate ink feed and distribution.

Unlike many commercial hybrid inks and coatings, which are in fact more like a typical UV ink and contain only some conventional materials (e.g. Suncure Hybrite, Sun Chemical), the inks and coatings of the present invention contain a considerable amount of conventional ink raw materials to get a good lithographic performance. The amounts of the materials are balanced in a way that a good part of the oils and alkyd resins are exchanged for an acrylate soluble inert hard resin, such as for example a modified maleic rosin resin or hydrocarbon resin, so that the drying speed is less affected.

An advantage of the hybrid ink of the present invention is that the lithography is positively affected and shows less misting, less feedback and a wider water-window than typical 100% radiation curable inks. This has been seen by lithotronic experiments, where the emulsified ink showed a stable torque over a wide range of water added and over several experiments, and on the offset print simulator (OPS), where the inks exhibit a stable ink film weight next to the printing plate under different water-settings.

Another advantage, due to the oil-based components, is that the color strength and flow from the ink duct is often better than with 100% radiation curable inks, as the oil-based materials such as alkyd resin evenly disperse and encapsulate pigments and lead to good color strength and good flow.

Another advantage is that the hybrid inks of the present invention, although they contain considerable amounts of conventional materials (oils & alkyd resin and inert hard resin such as rosin resin), can be run on typical UV rollers without UV-roller swelling. The table below shows the roller swelling and change of roller hardness when immersed into ink of Examples 1 and 2 for 7 days at 50° C.

tional hard resin, the inks of the present invention, unlike a soft conventional ink, do not penetrate so deep into the stock substrate, and sit more on the surface. This can also contribute to a higher color strength vs. a conventional ink at the same pigment loading, as the pigment sits on the surface and does not penetrate into the stock, which would lead to lower color strength.

The radiation curable inks and coatings of the present invention can be cured by an actinic light source, such as for example UV-light, provided by a high-voltage mercury bulb, a medium-voltage mercury bulb, a xenon bulb, a carbon arc lamp, a metal halide bulb, a UV-LED lamp or sunlight. The wavelength of the applied irradiation is preferably within a range of about 200 to 500 nm, more preferably about 250 to 350 nm. UV energy is preferably within a range of about 30 to 3,000 mJ/cm$^2$, and more preferably within a range of about 50 to 500 mJ/cm$^2$. In addition, the bulb can be appropriately selected according to the absorption spectrum of the radiation curable composition. Moreover, the inks of the present invention can be cured under inert conditions or as an ink laminated by a plastic foil.

Alternatively, actinic radiation may also include electron beam radiation (EB). Commercially, EB-dryers are available for example from Energy Science, Inc. of Wilmington, Mass., or from Advanced Electron Beams Inc. (AEB) of Wilmington, Mass. The energy absorbed, also known as the dose, is measured in units of kilo-Grays (kGy), one kGy being equal to 1,000 Joules per kilogram. Typically, the electron beam dose should be within the range of 10 kGy to about 40 kGy for complete curing. With the radiation curable composition of the present invention, preferably curing with a radiation dose of 20-30 kGy at an oxygen level of <200 ppm is usually sufficient to get a dry, solvent resistant ink.

Optionally, an infrared or thermal dryer on press can be used to accelerate the setting of the oil components.

Lithographic Performance:

The lithographic performance of the inks was assessed by two methods: (1) with a high speed lithotronic emulsification tester (Novocontrol GmbH, Germany); and (2) an "Ink

TABLE A

| | Example 1 Rosin-based: Roller Swelling [%]/Shore Hardness change [%] | Example 2 Hydrocarbon-based: Roller Swelling [%]/Shore Hardness change [%] |
|---|---|---|
| Standard EPDM UV Roller | 1.1/−1 | 0.8/0 |
| Alternative EPDM UV roller | −1.4/+2 | −1.2/+1 |
| EPDM soft roller | 1.0/−1 | 0.7/−1 |

The table above shows that the rollers are not significantly affected by the inks, as the dimension change of the rollers (volume increase or decrease of the rollers) is below 1.5%. Also, a loss of hardness of the rollers of no more than 2% is excellent.

The ink of the present invention can preferably be washed with typical press wash solutions for conventional inks, which was confirmed when the offset print simulator press was also washed with conventional washes after testing inks of Examples 1 and 2. Moreover, as the ink can be washed with conventional washes, the printing plate type can also be a non-baked plate type without the risk of eroding the surface with aggressive UV-washes.

Another predicted advantage, due to the limited amount of conventional liquid oil and increased amount of convenevaluation unit" KGB-0024 also called offset print simulator (OPS) from Mitsubishi Heavy Industries Ltd.

The lithotronic tester can perform emulsification tests at high speed and shear stress. It has been developed for the examination of water-ink interfacial phenomena under controlled conditions by computer support. The lithotronic tester measures the torque (viscosity) at a defined stirring speed. This torque is monitored when the fountain solution hits the ink. After a pre-conditioning phase with a defined temperature and speed, the fountain solution is added dropwise and the torque is monitored with increased amount of emulsified fount. The torque is related to viscosity of the emulsified ink.

The lithotronic experiment gives the following results. Firstly, a change of torque (viscosity) with increasing amount of fountain solution. This gives a measure of the stability of the emulsified ink (ideally no or small torque changes=excellent). Strong drop of torque (too coarse emulsion) or increase of torque (too fine emulsion)=poor. Secondly, the amount of emulsified water (emulsion capacity or water pickup). The water-pick up can influence the ink water/balance and the stability of the lithographic process. If the water-pick-up is too high, the ink may be over-emulsified, giving poor lithography and print quality, if water-pick up is too low, emulsification of the fountain solution becomes difficult.

Moreover, the lithographic performance of the inks of was assessed with an "Ink evaluation unit" KGB-0024 from Mitsubishi Heavy Industries Ltd, known as an offset ink print simulator (OPS). An "Ink evaluation unit" can easily simulate the behavior of printing materials such as ink, press plate and dampening water under conditions that closely simulate on-press printing conditions. The evaluation unit has a roller arrangement similar to an offset printing press, and the rotation speed covers all printing speeds of offset presses in the market. The difference from an actual printing press is that there is no substrate to be printed onto and the ink transferred from the plate to the blanket is not printed to a substrate, but transferred to a ductor roller and scraped off by a doctor blade. In addition to the other parameters, the transferred ink can be accurately measured by weight of ink collected. By this method, it can be assessed whether an ink under identical print conditions, such as ink and fountain settings, temperature, and roller speed, can provide a better lithographic performance.

As seen in Examples 1 and 2, in which the lithographic performance of the hybrid inks of the present invention was tested, a very stable ink film thickness next to the plate during various changes of water settings is achieved (see figures in the examples, smooth thick line on the bottom). This confirms a robust lithographic performance. No indication of feedback, stripping, or misting was observed.

Gloss Back:

In order to exploit the highest productivity of a fast curing UV-ink, an in-line coating with a UV overprint coating, which also provides high gloss, is often preferred. However, when a conventional sheet-fed ink is overprinted with a UV-ink and end-cured, the initial gloss of the coating after cure often drops within 24 hours by 10-25 gloss points. This also depends on the kind of substrates and is especially critical on open porous, non-coated substrates. This is often counter-acted by applying an aqueous primer between conventional ink and UV over-print varnish. However, this requires a double coater with an integrated thermal or infrared dryer on press and an additional aqueous coating, which adds additional time and expense to the process. Although these drying systems are available for presses such as ManRoland 700 Ultima or Heidelberg Speedmaster Duo, they are more a niche technology. By using a radiation curable hybrid ink of the present invention instead of a conventional ink, this can often be avoided and the gloss back effect is low without the need for an aqueous primer. With the hybrid inks of the present invention a balance was found with which a low gloss back effect is achieved giving a stable gloss, which is usually difficult to achieve with an aqueous coating. Nonetheless, the inks show a good lithographic performance. A small amount of gloss back may be seen when using the hybrid inks of the present invention, but preferably the degree of gloss back would be within preferred ranges. For high gloss hybrid inks (for example those with an initial gloss of > about 60), a drop in gloss <10 units is preferred; more preferably <7 units.

The substrate to be printed on may be composed of any typical substrate material such as paper, plastics, metals, and composites. The substrate may be paper print stock typically used for publications or may be a packaging material in the form of a cardboard sheet or corrugated board, a container such as a bottle or can, or the like. Furthermore, the packaging material may be a polyolefin, such as a polyethylene or a polypropylene, a polyester such as polyethylene terephthalate, or a metalized foil such as an laminated aluminum foil, a metalized polyester, or a metal container.

Inert Hard Resin

In certain embodiments, the radiation curable hybrid ink and coating compositions of the present invention comprise about 10 wt % to about 30 wt % one or more inert hard resins, based on the total weight of the ink or coating composition. For example, inert hard resins may be present in an amount of about 10 wt % to about 25 wt %; or about 10 wt % to about 20 wt %; or about 10 wt % to about 15 wt %; or about 12 wt % to about 30 wt %; or about 12 wt % to about 25 wt %; or about 12 wt % to about 20 wt %; or about 12 wt % to about 15 wt %; or about 15 wt % to about 30 wt %; or about 15 wt % to about 25 wt %; or about 15 wt % to about 20 wt %.

An inert hard resin is typically a natural or synthetic, amorphous material, which, for the purposes of the present invention, preferably forms a tack-free film at room temperature after application to a substrate. Most of these materials are oligomers or polymers.

Any inert hard resin that is compatible and/or soluble with the acrylate monomers and oligomers, oils and alkyd resins can be used in the hybrid inks of the present invention. Examples of preferred inert hard resins include rosin resin derivatives, which consist of a variety of isomers and different chemical structures, such as derivatives of abietic acid, levopimaric acid, neoabietic acid, palustric acid, dehydroabietic acid, pimaric acid and isopimaric acid. The rosin derivative can be modified with maleic anhydride or fumaric acid and esterified with polyols such as glycerol and pentaerythritol, or a phenolic rosin resin.

Preferred is maleic rosin resin which is soluble in acrylic monomers. Suitable maleic rosin resins include, but are not limited to, Jonrez IM 816, Jonrez IM 817, Jonrez IM 824, Jonrez IM 833 (all from Westvaco), Arez RE 3010 (AREZ International), Resinall's 440 and 445, Filtrez 3300 (AKZO). The preferred resins have a softening point >100° C., a cloud point >100° C. in 10% in % mineral test oil from Halterman Company, and an acid value of 10-40 mg KOH/g.

Other suitable inert hard resins are acrylate soluble hydrocarbon resins, and modified hydrocarbon resins. Preferred is an aromatic $C_9$ hydrocarbon resin having a softening point of >100° C. such as Norsolene 5125, 5135, 5145 (all from Cray Valley) or GA-120, a $C_9$ aromatic hydrocarbon resin (Luen Liang Industrial, Taiwan), combinations thereof, and the like.

In certain embodiments, the radiation curable hybrid ink and coating compositions of the present invention may further comprise other resins. For example, the radiation curable hybrid ink and coating compositions of the invention may comprise one or more resins selected from the group consisting of oil-modified phenolic resins, ketone resins, aldehyde-urea resins, oil modified polyester resins, melamine resins, epoxy resins, polyurethane resins, acrylic styrene resins, and combinations thereof, provided that the resin is soluble in the acrylic monomers, oligomers, oils and alkyds. When present, these additional resins may be present in an amount of about 1 wt % to about 20 wt %, based on the total weight of the ink or coating composition. For example, the additional resins may be present in an amount of about 1 wt % to about 15 wt %; or about 1 wt % to about 10 wt %; or about 1 wt % to about 5 wt %; or about 5 wt % to about 20 wt %; or about 5 wt % to about 15 wt %; or about 5 wt % to about 10 wt %; or about 10 wt % to about 20 wt %; or about 10 wt % to about 15 wt %.

Acrylate Monomers

In certain embodiments, the radiation curable hybrid ink and coating compositions of the invention comprise about 5 wt % to about 45 wt % of one or more multifunctional acrylate monomers, based on the total weight of the ink or coating composition. For example, the one or more multifunctional acrylate monomers may be present in an amount of about 5 wt % to about 40 wt %; or about 5 wt % to about 35 wt %; or about 5 wt % to about 30 wt %; or about 5 wt % to about 25 wt %; or about 5 wt % to about 20 wt %; or about 5 wt % to about 15 wt %; or about 5 wt % to about 10 wt %; or about 10 wt % to about 45 wt %; or about 10 wt % to about 40 wt %; or about 10 wt % to about 35 wt %; or about 10 wt % to about 30 wt %; or about 10 wt % to about 25 wt %; or about 10 wt % to about 20 wt %; or about 10 wt % to about 15 wt %; or about 15 wt % to about 45 wt %; or about 15 wt % to about 40 wt %; or about 15 wt % to about 35 wt %; or about 15 wt % to about 30 wt %; or about 15 wt % to about 25 wt %; or about 15 wt % to about 20 wt %; or about 20 wt % to about 45 wt %; or about 20 wt % to about 40 wt %; or about 20 wt % to about 35 wt %; or about 20 wt % to about 30 wt %; or about 20 wt % to about 25 wt %.

Examples of the monomers suitable for the inks of the present invention comprise acrylic monomers, having 2-6 acrylic groups. A non-limiting list of examples of acrylate monomers include 1,2-ethylene glycol diacrylate, 1,4-butandiol diacrylate, 1,6-hexandiol diacrylate, dipropylene glycol diacrylate, neopentylglycol diacrylate, ethoxylated neopentylglycol diacrylates, propoxylated neopentylglycol diacrylates, tripropylene glycol diacrylate, bisphenol-A diacrylate, ethoxylated bisphenol-A-diacrylates, bisphenol-A-diglycidylether diacrylate, ethoxylated bisphenol-A-diacrylates, poly(ethylene)glycol diacrylates, trimethylolpropane triacrylate, trimethylolpropane trimethacrylate, ethoxylated trimethylolpropane triacrylates, propoxylated trimethylolpropane triacrylates, propoxylated glycerol triacrylates, pentaerythritol triacrylate, ethoxylated pentaerythritol triacrylates, propoxylated pentaerythritol tetraacrylates, ethoxylated pentaerythritol tetraacrylates, ditrimethylolpropane tetraacrylate, dipentaerythritol pentaacrylate, dipentaerythritol hexaacrylate ethoxylated dipentaerythritol hexaacrylates or mixtures thereof, preferred are ethoxylated trimethylolpropane triacrylates, ethoxylated pentaerythritol triacrylates and propoxylated pentaerythritol tetraacrylates, and combinations thereof.

The radiation curable hybrid ink and coating compositions of the present invention may further comprise one or more monofunctional acrylate monomers. When present, the one or more monofunctional acrylate monomers are typically present in an amount of about 1 wt % to about 5 wt %, based on the total weight of the ink or coating composition. For example, the one or more monofunctional monomers may be present in an amount of about 1 wt % to about 3 wt %; or about 1 wt % to about 2 wt %; or about 2 wt % to about 5 wt %; or about 2 wt % to about 3 wt %; or about 3 wt % to about 5 wt %.

Suitable monofunctional acrylate monomers include, but are not limited to, tertiobutyl cyclohexanol acrylate, 2-(2-ethoxyethoxy)ethyl acrylate, tetrahydrofurfuryl acrylate, lauryl acrylate, 2-phenoxyethyl acrylate, isodecyl acrylate, ethoxylated phenyl acrylate, 3,3,5-trimethyl cyclohexanol acrylate, iso-octyl acrylate, octyl decyl acrylate, polycaprolactone acrylate, ethoxylated nonphenyl acrylate, isobornyl acrylate, cyclic trimethylolpropane formal acrylate, stearyl acrylate, behenyl acrylate, alkoxylated lauryl acrylate, combinations thereof, and the like.

Oils

The radiation curable hybrid ink and coating compositions of the invention may further comprise one or more oils, including vegetable oils and mineral oils. When present, the one or more oils may be present in an amount of about 0.1 wt % to about 25 wt %, based on the total weight of the ink or coating composition. For example, the one or more oils may be present in an amount of about 0.1 wt % to about 20 wt %; or 0.1 wt % to about 15 wt %; or about 0.1 wt % to about 10 wt %; or about 0.1 wt % to about 5 wt %; or about 0.1 wt % to about 1 wt %; or about 0.1 wt % to about 0.5 wt %; or about 0.5 wt % to about 25 wt %; or about 0.5 wt % to about 20 wt %; or about 0.5 wt % to about 15 wt %; or about 0.5 wt % to about 10 wt %; or about 0.5 wt % to about 5 wt %; or about 0.5 wt % to about 1 wt %; or about 1 wt % to about 25 wt %; or about 1 wt % to about 20 wt %; or about 1 wt % to about 15 wt %; or about 1 wt % to about 10 wt %; or about 1 wt % to about 5 wt %; or about 5 wt % to about 25 wt %; or about 5 wt % to about 20 wt %; or about 5 wt % to about 15 wt %; or about 5 wt % to about 10 wt %.

Examples of oils used in the hybrid ink of the present invention can be a hydrocarbon oil or a vegetable oil or a combination thereof. Suitable hydrocarbon oils include paraffinic oils, such as white mineral oils (CAS No. 8042-47-5), e.g., Magie N-40 oil; naphthenic oils and distillates, such as hydrotreated light naphthenic distillates (CAS No. 64742-53-6), e.g., Nytex 5130, and hydrotreated heavy naphthenic distillates (CAS No. 64742-55-5), e.g., Nytex 510). Also suitable is a heavy oil, such as a mineral oil having a density between 0.85-0.91. An exemplary heavy oil is Printosol 30/40 AP85 from Haltermann (Channelview, Tex.).

The vegetable oils can be one or more drying oils, semi-drying oils and non-drying oils. Examples include almond oil, cacao oil, candlenut oil, castor oil, dehydrated castor oil, coconut oil, corn oil, cottonseed oil, grape seed oil, hempseed oil, linseed oil, olive oil, palm kernel oil, peanut oil, rapeseed oil, rice bran oil, safflower oil, sunflower oil, sesame oil, soybean oil, tall oil, tung oil and walnut oil, including combinations and fatty acid esters, such as fatty acid alkyl esters thereof.

Alternatively, the oil can be one or more fatty acid alkylester, as for example rapeseed methylester, rapeseed isopropylester, caprylic acid methylester, capric acid isoproplyester, laurylic acid methylester, myristic acid methylester, palmitic acid methylester, stearic acid methylester, oleic acid ethylester, erucic acid methylester, ricinoleic acid methyl ester, linoleic acid ethyl ester, linolenic acid methyl ester or palmitic acid isopropylester.

Alkyd Resin

The radiation curable hybrid ink or coating compositions of the invention may further comprise one or more alkyd resins. When present, the one or more alkyd resins may be present in an amount of about 1 wt % to about 15 wt %, based on the total weight of the ink or coating composition. For example, the one or more alkyd resins may be present in an amount of about 1 wt % to about 12 wt %; or about 1 wt % to about 10 wt %; or about 1 wt % to about 8 wt %; or about 1 wt % to about 5 wt %; or about 1 wt % to about 3 wt %; or about 1 wt % to about 2 wt %; or about 2 wt % to about 15 wt %; or about 2 wt % to about 12 wt %; or about 2 wt % to about 10 wt %; or about 2 wt % to about 8 wt %; or about 2 wt % to about 5 wt %; or about 2 wt % to about 3 wt %; or about 3 wt % to about 15 wt %; or about 3 wt % to about 12 wt %; or about 3 wt % to about 10 wt %; or about 3 wt % to about 8 wt %; or about 3 wt % to about 5 wt %; or about 5 wt % to about 15 wt %; or about 5 wt % to about 12 wt %; or about 5 wt % to about 10 wt %; or about 5 wt % to about 8 wt %.

Alkyds are polyesters modified by the addition of fatty acids and other components. In the ink of the present invention, alkyds are typically present in molecular weights ranging from about 1,000 to 20,000.

An alkyd can be the reaction product between a polyhydric alcohol and an acid or acid anhydride. The alkyds can be modified with fatty acids, saturated or unsaturated, preferably from plant and vegetable oils. Non-limiting examples of such acids include sebatic acid, lauric acid, stearic acid, myristic acid, palmitic acid, oleic acid, linoleic acid, arachidic acid, behenic acid, erucic acid, linolic acid, linoelaidic acid, eleostearic acid, timnodonic acid, arachidonic acid, clupanodonic acid, ricinolic acid, ricinelaidic acid, versatic acid, citric acid, oxalic acid, malonic acid, succinic acid, glutaric acid, maleic acid, fumaric acid, phthalic acid, isophthalic acid, terephthalic acid, trimellitic acid, combinations thereof, and the like.

In another embodiment, alkyds are produced whereby vegetable oil is trans-esterified by the addition of a polyol. The polyol may be glycerol in an exemplary embodiment. One example for oil is tall oil. Alternatively, the alkyd may include soya oil, sunflower oil, rapeseed oil, corn oil, tung oil, linseed oil, coconut oil and palm oil. Alternatively, the alkyd may be any combination of those mentioned above.

Acrylate Oligomers

The radiation curable hybrid ink and coating compositions of the invention may further comprise one or more acrylate oligomers. When present, the one or more acrylate oligomers are typically present in an amount of about 1 wt % to about 10 wt %, based on the total weight of the ink or coating composition. For example, the one or more acrylate oligomers may be present in an amount of from about 1 wt % to about 8 wt %; or about 1 wt % to about 5 wt %; or about 1 wt % to about 3 wt %; or about 1 wt % to about 2 wt %; or about 2 wt % to about 10 wt %; or about 2 wt % to about 8 wt %; or about 2 wt % to about 5 wt %; or about 3 wt % to about 10 wt %; or about 3 wt % to about 8 wt %; or about 3 wt % to about 5 wt %.

Preferably, acrylate oligomers have a number average molecular weight of about 400-3,000 Daltons, and preferably an acrylate functionality >2. Examples of suitable acrylate oligomers include, but are not limited to, acrylated oils, based on linseed-, soy- and castor oil, epoxy acrylates, oil modified polyester acrylates such as Ebecryl 870 (Allnex), acrylated polyurethanes, acrylated polyacrylates, acrylated polyethers and acrylated amines, to impart rheology, pigment wetting, transfer, gloss, chemical resistance and other film properties. Preferred is acrylated oil or an oil-modified polyester.

Colorants

The radiation curable hybrid ink and coating compositions of the present invention may further comprise one or more colorants in the form of a dye or pigment. When present, the one or more colorants are present in an amount of about 1 wt % to about 20 wt %, based on the total weight of the ink or coating composition. For example, the one or more colorants may be present in an amount of about 1 wt % to about 15 wt %; or about 1 wt % to about 10 wt %; or about 1 wt % to about 5 wt %; or about 1 wt % to about 3 wt %; or about 1 wt % to about 2 wt %; or about 2 wt % to about 20 wt %; or about 2 wt % to about 15 wt %; or about 2 wt % to about 10 wt %; or about 2 wt % to about 5 wt %; or about 2 wt % to about 3 wt %; or about 5 wt % to about 20 wt %; or about 5 wt % to about 15 wt %; or about 5 wt % to about 10 wt %; or about 10 wt % to about 20 wt %; or about 10 wt % to about 15 wt %; or about 15 wt % to about 20 wt %.

Pigments suitable for use in the present invention include conventional organic or inorganic pigments. Representative pigments include, but are not limited to, Pigment Yellow 1, Pigment Yellow 3, Pigment Yellow 12, Pigment Yellow 13, Pigment Yellow 14, Pigment Yellow 17, Pigment Yellow 63, Pigment Yellow 65, Pigment Yellow 73, Pigment Yellow 74, Pigment Yellow 75, Pigment Yellow 83, Pigment Yellow 97, Pigment Yellow 98, Pigment Yellow 106, Pigment Yellow 111, Pigment Yellow 114, Pigment Yellow 121, Pigment Yellow 126, Pigment Yellow 127, Pigment Yellow 136, Pigment Yellow 138, Pigment Yellow 139, Pigment Yellow 174, Pigment Yellow 176, Pigment Yellow 188, Pigment Yellow 194, Pigment Orange 5, Pigment Orange 13, Pigment Orange 16, Pigment Orange 34, Pigment Orange 36, Pigment Orange 61, Pigment Orange 62, Pigment Orange 64, Pigment Red 2, Pigment Red 9, Pigment Red 14, Pigment Red 17, Pigment Red 22, Pigment Red 23, Pigment Red 37, Pigment Red 38, Pigment Red 41, Pigment Red 42, Pigment Red 48: 2, Pigment Red 53: 1, Pigment Red 57: 1, Pigment Red 81: 1, Pigment Red 112, Pigment Red 122, Pigment Red 170, Pigment Red 184, Pigment Red 210, Pigment Red 238, Pigment Red 266, Pigment Blue 15, Pigment Blue 15: 1, Pigment Blue 15: 2, Pigment Blue 15: 3, Pigment Blue 15: 4, Pigment Blue 61, Pigment Green 7, Pigment Green 36, Pigment Violet 1, Pigment Violet 19, Pigment Violet 23, Pigment Black 7, combinations thereof, and the like.

Dyes suitable for use in the present invention include, but are not limited to azo dyes, anthraquinone dyes, xanthene dyes, azine dyes, combinations thereof, and the like.

Photoinitiators

The radiation curable hybrid ink and coating compositions of the present invention may further comprise, if cured by UV-light, one or more photoinitiators. When present, the one or more photoinitiators are typically present in an amount of about 0.1 wt % to about 20 wt %, based on the total weight of the ink or coating composition. For example, the one or more photoinitiators may be present in an amount of about 0.1 wt % to about 15 wt %; or about 0.1 wt % to about 10 wt %; or about 0.1 wt % to about 5 wt %; or about 0.1 wt % to about 3 wt %; or about 0.1 wt % to about 1 wt %; or about 0.1 wt % to about 0.5 wt %; or about 0.5 wt % to about 20 wt %; or about 0.5 wt % to about 15 wt %; or about 0.5 wt % to about 10 wt %; or about 0.5 wt % to about 5 wt %; or about 0.5 wt % to about 1 wt %; or about 1 wt % to about 20 wt %; or about 1 wt % to about 15 wt %; or about 1 wt % to about 10 wt %; or about 1 wt % to about 5 wt %; or about 1 wt % to about 3 wt %; or about 1 wt % to about 2 wt %.

Examples of suitable photoinitiators include, but are not limited to, benzophenones, benzilketales, dialkoxy acetophenones, hydroxyalkyl-acetophenones, aminoalkylphenones, acylphosphinoxides and thioxanthones, for example benzophenone, methylbenzophenone, 4-phenylbenzophenone, 4,4'-bis(dimethylamino)-benzophenone, 4,4'-bis(diethylamino)-benzophenone, 2,2-dimethoxy-2-phenylacetophenone, dimethoxyacetophenone, diethoxy-acetophenone, 2-hydroxy-2-methyl-1-phenylpropan-1-one, 2-benzyl-2-dimethylamino-1-(4-morpholinophenyl)-butan-1-one, 2-methyl-1-[4(methoxythio)-phenyl]-2-morpholinopropan-2-one, diphenylacylphenyl phosphinoxide, diphenyl(2,4,6-trimethylbenzoyl) phosphinoxide, 2,4,6-trimethylbenzoylethoxyphenyl phosphinoxide, 2-isopropylthioxanthone, 4-isopropylthioxanthone, 2,4-dimethylthioxanthone or mixtures thereof. In the case of EB-curable inks, photoinitiators are not required.

For an ink designed for food packaging, migrating low molecular weight monomeric photoinitiators are preferably minimized, or more preferably completely replaced by oligomeric or polymeric photoinitiators. Suitable photoinitiators are, for example, photoinitiators containing oligomeric benzophenone derivatives such as for example Omnipol BP from IGM resins, oligomeric amines such as for example Genopol AB-1 from Rahn Group or oligomeric type-I-photo initiators such as Omnipol 910 from IGM company.

Other Optional Additives

In order to avoid premature polymerization of the double-bonds in the oils and alkyd resin, an antioxidant can be added. Exemplary anti-oxidants include ascorbic acid, astaxanthin, carotene, chroman (3,4-dihydro-2H-1-benzopyran), hexamethylene bis(3,5-di-tert-butyl-4-hydroxyhydro-cinnamate), octadecyl 3,5-di-tert-butyl-4-hydroxyhydro-cinnamate, vitamin E and vitamin E analogs, mono-tert-butylhydroquinone (MTBHQ) and butylated hydroxy toluene (BHT). Preferred anti-oxidants are MTBHQ and BHT. When present, antioxidants are typically present in an amount of about 0.1 wt % to about 4 wt %, based on the total weight of the ink or coating composition. For example, the one or more antioxidants may be present in an amount of about 0.1 wt % to about 3 wt %; or about 0.1 wt % to about 2 wt %; or about 0.1 wt % to about 1 wt %; or about 0.1 wt % to about 0.5 wt %; or about 0.5 wt % to about 4 wt %; or about 0.5 wt % to about 3 wt %; or about 0.5 wt % to about 2 wt %; or about 0.5 wt % to about 1 wt %; or about 1 wt % to about 4 wt %; or about 1 wt % to about 3 wt %; or about 1 wt % to about 2 wt %; or about 2 wt % to about 4 wt %; or about 2 wt % to about 3 wt %; or about 3 wt % to about 4 wt %.

In order to accelerate the drying of oils and alkyds, the ink may contain one or more dryers, which are typically fatty acid salts, such as heavy metal salts (e.g. cobalt and manganese) of organic carboxylic acids. Examples of these heavy metal salts of organic carboxylic acids include, but are not limited to, cobalt/manganese linoleate, hexadeconate or octoate (e.g., see U.S. Pat. Nos. 5,156,674; 6,899,756; 7,811,367). The dryer can be any of the commercially available metal dryers, such as those based on cobalt or manganese or cobalt/manganese combinations. A number of cobalt/manganese dryers are commercially available as cobalt/manganese linoleate, hexadeconate or octoate. Preferred is a cobalt-free dryer. When present, the one or more dryers are typically present in an amount of about 0.1 wt % to about 3 wt %, based on the total weight of the ink or coating composition. For example, the one or more dryers may be present in an amount of about 0.1 wt % to about 2 wt %; or about 0.1 wt % to about 1 wt %; or about 0.1 wt % to about 0.5 wt %; or about 0.5 wt % to about 3 wt %; or about 0.5 wt % to about 2 wt %; or about 0.5 wt % to about 1 wt %; or about 1 wt % to about 3 wt %; or about 1 wt % to about 2 wt %; or about 2 wt % to about 3 wt %.

The hybrid inks and coatings of the present invention may further contain the usual additives to modify flow, surface tension, gloss, pigment wetting and abrasion resistance of the cured coating or printed ink. Such additives contained in inks or coatings typically are surface-active agents, waxes, shelf-life stabilizers, etc. and combinations thereof. These additives may function as leveling agents, shelf-life stabilizers, wetting agents, slip agents, flow agents, dispersants and de-aerators. Preferred additives include fluorocarbon surfactants, silicones and organic polymer surfactants. Examples include the Tegorad product lines (Tegorad are trademarks and are commercially available products of Tego Chemie, Essen, Germany) and the Solsperse product lines (Solsperse are trademarks and are commercially available products of Lubrizol Company). When present, these one or more additives are generally present in an amount of about 0.1 wt % to about 4 wt %, based on the total weight of the ink or coating composition. For example, the one or more antioxidants may be present in an amount of about 0.1 wt % to about 3 wt %; or about 0.1 wt % to about 2 wt %; or about 0.1 wt % to about 1 wt %; or about 0.1 wt % to about 0.5 wt %; or about 0.5 wt % to about 4 wt %; or about 0.5 wt % to about 3 wt %; or about 0.5 wt % to about 2 wt %; or about 0.5 wt % to about 1 wt %; or about 1 wt % to about 4 wt %; or about 1 wt % to about 3 wt %; or about 1 wt % to about 2 wt %; or about 2 wt % to about 4 wt %; or about 2 wt % to about 3 wt %; or about 3 wt % to about 4 wt %.

The radiation curable hybrid ink of the present invention may further contain the usual extenders such as clay, talc, calcium carbonate, magnesium carbonate or silica to adjust water pickup, misting and color strength. When present, the one or more extenders or fillers are typically present in an amount of about 1 wt % to about 10 wt %, based on the total weight of the ink or coating composition. For example, the one or more extenders or fillers may be present in an amount of about 1 wt % to about 8 wt %; or about 1 wt % to about 5 wt %; 1 wt % to about 4.5 wt %; or about 1 wt % to about 4 wt %; or about 1 wt % to about 3.5 wt %; or about 1 wt % to about 3 wt %; or about 1 wt % to about 2.5 wt %; or about 1 wt % to about 2 wt %; or about 1 wt % to about 1.5 wt %; or about 2 wt % to about 10 wt %; or about 2 wt % to about 8 wt %; or about 2 wt % to about 5 wt %; or about 2 wt % to about 4.5 wt %; or about 2 wt % to about 4 wt %; or about 2 wt % to about 3.5 wt %; or about 2 wt % to about 3 wt %; or about 2 wt % to about 2.5 wt %; or about 3 wt % to about 10 wt %; or about 3 wt % to about 8 wt %; or about 3 wt % to about 5 wt %; or about 3 wt % to about 4.5 wt %; or about 3 wt % to about 4 wt %; or about 3 wt % to about 3.5 wt %; or about 4 wt % to about 10 wt %; or about 4 wt % to about 8 wt %; or about 4 wt % to about 5 wt %.

Preparation of Radiation Curable Hybrid Inks and Coatings

The ink can be made by typical procedures known in the art, usually by dry-grinding or using a flush, color concentrate, or base.

In a typical dry-grind manufacturing procedure for inks, the required amount of dry pigment is mixed with conventional oils, alkyd resin, inert hard resins and acrylate in a dissolver or mixer for 15-30 minutes to wet out all pigment. Typically, the inert hard resin is introduced as a solution in either oil or acrylate monomer (varnish). The pre-mix is then ground on a three roll mill (or other grinding mill) at a pressure of about 1-4 MPa and a temperature of 20-40° C. until the desired grind specifications are met. Photoinitiators can be added before or after grinding in the form of a solution or paste.

In the "flushing process" the wet pigment press cake is "flushed" in high shear grinding equipment like, for example, a sigma blade mixer. Oil, varnish, alkyd and/or other non-aqueous hydrophobic vehicles are added and the pigment will eventually flush into the organic phase and leave the water phase clear of pigment. A substantial part of the water can then be poured off. In order to remove the remaining water, usually heat and vacuum is applied. The resulting product is called a "flush paste" or pigment concentrate (base). Then, the pigment concentrate is diluted with acrylate monomer, oligomer, optional photoinitiator and solution of inert hard resin (varnish).

This is preferred from the viewpoint of versatility. A color concentrate which is used for a cold-set ink, a heat-set ink or a sheet-fed ink, is highly appreciated by a formulator provided that he could use it also in a UV-hybrid ink.

EXAMPLES

The following examples illustrate specific aspects of the present invention and are not intended to limit the scope thereof in any respect and should not be so construed.
Viscosity Viscosity was determined with a Physika 300 cone and plate rheometer from Anton Parr GmbH at a shear rate of D=2–100 l/s. The viscosity value at D=50 l/s was recorded (Pa·s).
Tack Tack was measured with a calibrated "Tack-o-scope" instrument (Model 2001) from IGT Testing Systems, Netherlands. 1 ml of ink was placed on the EPDM rubber distribution roller at 30° C., distributed for 90 seconds at a roller speed of 50 rpm, then 30 seconds at 300 rpm. The tack value was then taken at a roller speed of 150 rpm.

Alternatively, the tack was measured with an inkometer (Prufbrau Model T-90) at 30° C. and 300 rpm.
Flow The flow was measured with a vertically arranged aluminum plate on which 1 ml of ink was placed. The distance in cm that the ink ran down the plate after 15 minutes was recorded.
Lithography
First Procedure: (High Speed Lithotronic Emulsification Tester)

The lithographic performance of the inks was checked with a high speed lithotronic emulsification tester (Novocontrol GmbH, Germany). For a Lithotronic testing, 25 g of ink was filled into a mixing bowl, which was then mounted and fixed into position by the clamping arrangement. While stirring the ink under a controlled shear stress, continuous liquid (fount solution) flow into the mixing bowl was achieved by a precision miniature pump. The liquid flow was digitally controlled by the microprocessor system, providing a calibrated flow characteristic.

Conditions: Flow=2 ml/minute at 1200 rpm. T=40° C., Fount=deionized water.

Rating: Significant change of the torque curve (more than 50%)=poor; medium change of the torque curve (20% to 50%)=acceptable; minor change of the torque curve (less than 20%)=good. In general, a minor change of torque curve (viscosity) of an ink during increased emulsification is considered an ink with a robust lithography.
Second Procedure: (Offset Print Simulator)

1 Kg of experimental ink was placed into the ink duct of an "Ink evaluation unit" KGB-0024 from Mitsubishi Heavy Industries Ltd. The fountain solution contained de-ionized water, Sunfount 480™ (1%) from Sun Chemical Company, isopropyl alcohol (5%), and re-hardener (0.5%). The roller speed was set to 300 meters per minute, and roller temperature was 30° C. The ink was run for about 20 minutes (starting dampening settings 35%, ink settings constant at 8%) in order to achieve a constant film thickness of about 2.5 µm, measured by an ink thickness sensor near the printing plate. Water content on the plate was also measured by an infrared sensor.

Then, the fountain solution setting was decreased by 5% after 2 minutes, and 10% after 4 minutes. Then, the fountain solution was re-increased by 10% at 6 minutes, and further increased by 3%, 6%, 9%, and 12% at 8, 10, 12, and 14 minutes respectively, and then back to starting dampening settings. The change of film thickness and water content was detected, which is the main criteria for a stable lithography. A change of less than or equal to plus or minus 25% in the ink film properties (film thickness and water content) was rated as a minor change, indicating that the ink is stable.
Misting Misting was assessed at different places on the offset print simulator, usually near an ink duct and a printing plate. A white piece of paper was placed at a defined distance from the ink rollers, and the press was run for a defined period of time, and at a defined speed and temperature. Then, the ink mist that was transferred to the paper was assessed by visual comparison to a master example or by measurement with a densitometer. Very little ink on the paper means that the ink has very low misting (excellent) and low tendency to contaminate the printing press and press room with ink mist.
Gloss Gloss was measured using a Micro Gloss Instrument from BYK-Gardner, set at an angle of 60 degrees. Gloss is reported as gloss units.
Assessment of Cure The cure of a print was assessed by how much ink from a cured print was transferred (set-off) to another piece of paper under high pressure. This simulates the condition in a large paper stack or substrate roll where the freshly cured prints are stored under pressure.

Ideally, no ink is transferred. Usually, the transfer of ink of an experimental ink to the test paper is compared to a control UV ink intended for the same application (e.g. Suncure Carton ink [Sun Chemical] for paper and board). The amount of set-off ink at a defined UV-dose is a measure for the reactivity and achievable cure speed (productivity).

The cure of the ink is assessed by the set-off test, employed by the following method: the ink was applied onto a surface of a cardboard substrate with a print proofer in an appropriate optical density (OD). OD is measured by a densitometer. Suitable printed optical densities for lithographic inks are 0.9-1.5 (yellow), 1.0-1.65 (cyan), 1.0-1.5 (magenta), and 1.1-1.9 (black), depending on the substrate. Directly after UV-cure with a 200 Watt Fusion H-bulb at a line speed of 400 feet/min, delivering a UV-dose of about 33 mJ/cm$^2$, the reverse surface of a paper board substrate (incada exel or silk—3×3 cm$^2$) was applied on the cured ink sample. Both were introduced on a press and a pressure of 10 tons was applied. The print was released as soon as the pressure was reached (1-second pressure time). The set off material (transferred ink) on the board substrate was measured with a Gretag D19C Densitometer and compared to a control ink (e.g. Suncure Carton ink [Sun Chemical] for paper and board).

By comparing to a control ink, under the same curing conditions and printed density, the ink with a lower number on the densitometer indicates better cure. A densitometer reading (see set-off values in Table 2 for example) lower than 0.50 is usually considered a good value.
Ink Grinding Test Fineness of ink grind is an important parameter that describes the quality of dispersion of solid pigment particles in the ink. A grindometer was used to test the fineness of the pigment particles. The grindometer consists of a steel block with a channel of varying depth machined into it, starting at a convenient depth for the type of ink to be measured, and becoming shallower until it ends flush with the block's surface. The depth of the groove is marked off on a graduated scale next to it. The ink to be tested was poured into the deep end of the groove, and scraped towards the shallow end with a flat metal scraper. At the of point of 4 µm on the graduated scale, the ink track was inspected for the number of large irregularities (first number in bracket), and the number of small irregularities (second number in bracket). A score of (0/0) means that there are neither large particles nor small irregularities observed, and the ink is rated as having passed.

Examples 1 and 2. Cyan Hybrid Inks Containing 20% Inert Hard Resin

Inventive cyan hybrid inks were made from dry grind on a three roll mill, 3 passes at 2 MPa (25° C.), having the composition shown in Table 1 (about 20% inert hard resin).

TABLE 1

Examples 1 and 2

| Raw Materials | Example 1 (weight %) | Example 2 (weight %) |
|---|---|---|
| [1]Varnish (Jonrez IM-824, Maleic Rosin resin/TMPTA | — | 45.50 |
| [2]Varnish (Norsolene S-125 (Hydrocarbon resin)/TMPTA | 45.50 | — |
| Ebecryl TMPTA (Allnex) | 5.50 | 5.50 |
| Photomer 3005 F (IGM) | 10.00 | 10.00 |
| Irgacure 369 (BASF) | 2.5 | 2.50 |
| Omnirad EHA (IGM) | 6.00 | 6.00 |
| Omnirad 4-PBZ (IGM) | 3.50 | 3.50 |
| Omnirad OMBB (IGM) | 1.00 | 1.00 |
| Florstab UV1 (Kromachem) | 1.00 | 1.00 |
| Micronized talc | 3.00 | 3.00 |
| Dynoadd F1 (Dynea) | 0.50 | 0.50 |
| [3]Fastogen Blue FA5375 | 21.50 | 21.50 |
| Total | 100.00 | 100.00 |

[1]40% Jonrez IM-824 (Resinall), 58.5% trimethylolpropoane triacrylate, 1.5% Genorad 16 (Rahn Group)
[2]40% Norsolene S-125 (Cray valley), 58.5% trimethylolpropoane triacrylate, 1.5% Genorad 16 (Rahn Group)
[3]Fastogen Blue FA5375 (Sun Chemical) = 91% pure phthalo cyanine pigment and 9% rosin resin The properties of Example 1 and 2 inks were tested as described above. The results are shown in Table 1A.

TABLE 1A

Properties of Examples 1 and 2

| | Example 1 | Example 2 |
|---|---|---|
| Viscosity [Pa*s] @50 s−1 | 38.1 | 31.79 |
| Tack-o-scope 150 [units] | 218 | 320 |
| Flow after 15 min. [cm] | 2.5 | 7 |
| Set-off UV-curing test curing @ [1]OD 1.58 | | |
| [2]after 33 mJ/cm² | 0.31 | 0.35 |
| [2]after 66 mJ/cm² | 0.03 | 0.03 |
| [2]100 mJ/cm² | 0.00 | 0.01 |
| [2]after 133 mJ/cm² | 0.00 | 0.00 |
| Lithography on offset print simulator (see drawings) | Stable ink film weight next to plate = good | Stable ink film next to plate weight = good |
| Misting | Near ink duct and printing plate = low | Near ink duct and printing plate = low |

[1]Optical density of printed ink on printed substrate.
[2]Optical density of set-off ink on the unprinted substrate.

The Example 1 and 2 inks, as shown in Table 1A, exhibit typical values of viscosity (20-60 Pas), flow (2-10 cm) and tack (200-350 units) of a UV lithographic ink.

Figure 2:
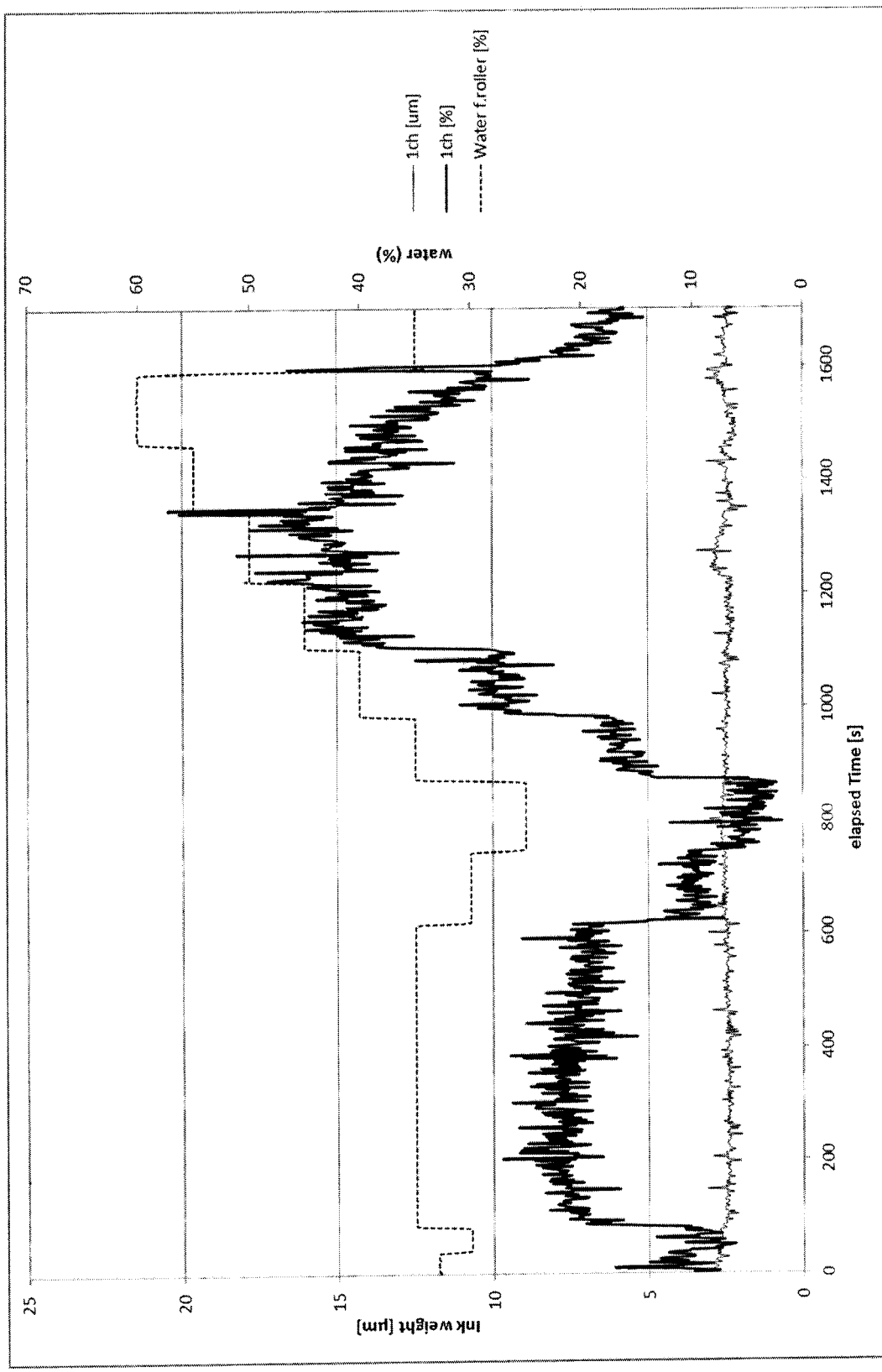
FIG. 2 shows the visualized ink film thickness (1-ch thin line) of the ink of Example 2, measured with a sensor next to the printing plate during reduction and increase of water settings on the offset print simulator. The stable thin line (1ch) indicates a robust lithography.

In both the lithotronic and offset print simulator run tests, the Example 1 and 2 inventive inks exhibit only a small change in the torque curve and maintain a stable ink film thickness near the printing plate (see figures), indicating robust lithographic performance. In FIGS. 1 and 2, the dashed line is water settings; the thin line (1-ch μm) is ink film thickness in μm next to the printing plate; and the thick line (1ch %) is water content % on the sensor next to the plate. Surprisingly, even with a relatively high amount of inert hard resin (non UV-reactive material), the UV-drying property is still good (lithographic performance assessed using ink evaluation unit KGB-0024 from Mitsubishi Heavy Industries Ltd: See drawings Examples 1 and 2).

Example 2A. Cyan Hybrid Ink Containing 27.2% Inert Hard Resin

A further inventive cyan hybrid ink was made from dry grind on a three roll mill, 3 passes at 2 MPa (25° C.), having the composition shown in Table 1B (about 27.2% inert hard resin material). The properties of Example 2A, measured as described above, are shown in Table 1C.

TABLE 1B

Example 2A

| Raw Materials | Example 2A (weight %) |
|---|---|
| [4]Varnish (A-Rez RE 3003 (Modified rosin ester)/TMPTA | 53.00 |
| Ebecryl TMPTA (Allnex) | 5.50 |
| Photomer 3005 F (IGM) | 3.00 |
| Irgacure 369 (BASF) | 2.50 |
| Omnirad EHA (IGM) | 6.00 |
| Solsperse 39000 (Lubrizol) | 0.50 |
| Omnirad 4-PBZ (IGM) | 3.50 |
| Omnirad OMBB (IGM) | 1.00 |
| Florstab UV1 (Kromachem) | 1.00 |
| Micronized talc | 2.00 |
| Dynoadd F1 (Dynea) | 0.50 |
| Fastogen Blue FA5375 | 21.50 |
| Total | 100.00 |

[4]48.5% ARez RE 3003 (Arez International), 50.0% trimethylolpropoane triacrylate, 1.5% Genorad 16 (Rahn Group)

TABLE 1C

Properties of Example 2A

| | Example 2A |
|---|---|
| Viscosity [Pa*s] @50 s−1 | 47.69 |
| Tack-o-scope 150 [units] | 341 |
| Flow after 15 min. [cm] | 4 |
| Set-off UV-curing test curing @ OD 1.58 | |
| after 33 mJ/cm² | 0.45 |
| after 66 mJ/cm² | 0.21 |
| 100 mJ/cm² | 0.04 |
| after 133 mJ/cm² | 0.01 |

Examples 3 and 4: Cyan Hybrid Inks Containing 17% Inert Hard Resin

Inventive cyan hybrid inks were made from dry grind on a three roll mill, 3 passes at 2 MPa (25° C.), having the composition shown in Table 2 (about 17% inert hard resin and 9% alkyd resin).

TABLE 2

Examples 3 and 4

| Raw Materials | Example 3 (weight %) | Example 4 (weight %) |
|---|---|---|
| [5]Varnish (Suntack GA-120 Hydrocarbon resin)/TMPTA | 35.00 | |
| [6]Varnish (Arez 3010, Maleic Rosin)/TMPTA** | | 35.00 |
| Alkyd CHS-6550 (Spolchemie) | 10.00 | 10.00 |
| Photomer 3005 (IGM) | 10.00 | 10.00 |
| Dynoadd F1(Dynea) | 0.50 | 0.50 |
| Florstab UV1(Kromachem) | 1.00 | 1.00 |
| Ebecryl TMPTA (Allnex) | 5.50 | 5.50 |
| Irgacure 369 (BASF) | 2.5 | 2.5 |
| Omnirad EHA (IGM) | 6.00 | 6.00 |
| Omnirad 4-PBZ (IGM) | 3.50 | 3.50 |
| Omnirad OMBB (IGM) | 1.00 | 1.00 |
| Micronized talc | 3.00 | 3.00 |
| Fastogen Blue FA5375 (Sun Chemical) | 22.00 | 22.00 |
| Total | 100.00 | 100.00 |

[5]42% Suntack GA-120 (UPM resin, Taiwan), trimethylolpropoane triacrylate 56.5%, 1.5% Genorad 16 (stabilizer from Rahn Group)
[6]43% Arez 3010 (A-REZ), 58.5% trimethylolpropoane triacrylate, 1.5% Genorad 16 (stabilizer from Rahn Group)

The properties of Examples 3 and 4 were tested as described above. The results are shown in Table 2A.

TABLE 2A

Properties of Examples 3 and 4

| | Example 3 | Example 4 |
|---|---|---|
| Ink Viscosity [Pa*s] @50 1/s | 28.03 | 32.74 |
| Ink Tack INKOMAT [units] @ 300 rpm/30° C. | 16.5 | 14.6 |
| Ink Grinding test | 0/0 | 0/0 |
| Printed @OD | 1.53 | 1.54 |
| 33 mJ/cm$^2$ | 0.41 | 0.48 |
| 66 mJ/cm$^2$ | 0.18 | 0.30 |
| 100 mJ/cm$^2$ | 0.07 | 0.09 |
| Lithography on lithotronic tester | Small change of torque (≤25%) during emulsification = good | Small change of torque ((≤25%) during emulsification = good |
| [1]Water-pick-up on lithotronic tester [g] out of 25 g of ink | 12.8 | 9.5 |

[1]The amount of water in g that can be added to the ink before the emulsion becomes unstable.

For Examples 3 and 4, no indication of the presence of scum or tinting of the emulsified ink was found. The torque values measured under emulsification were very similar compared to those from commercial inks from the Sun Chemical Sheet-fed ink product portfolio.

Example 5. Cyan Hybrid Ink Made with Cyan Color Base Containing 25% Inert Hard Resin A cyan color concentrate base was made from 25% inert hard resin, pigment, about 20% alkyds, and about 29% oils by pre-dispersing the raw materials for 25 minutes to wet out the pigment in a dissolver, followed by a three roll mill, 3 passes at 2 MPa (25° C.), having the composition in Table 3:

TABLE 3

Example 5A Color Base

| Raw material | Weight % |
|---|---|
| Bleached Linseed oil (Mosselman) | 6.50 |
| Refined soya bean oil (Mosselman) | 9.00 |
| Rapeseed methyl ester Radia 7490 (Oleon) | 11.50 |
| Maleic rosin resin Jonrez 824 (Resinall) | 7.50 |
| Alkyd resin CHS 6550 (Spolchemie) | 20.00 |
| Phenolic rosin resin Unikprint 3342 (United resins) | 15.00 |
| Fastogen blue pigment FA 5375 | 27.50 |
| Aliphatic Mineral oil (Halterman) | 1.80 |
| Butylated hydroxytoluene | 1.20 |
| Total | 100.00 |

Next, the cyan color base was mixed in a dissolver with trimethylolpropane triacrylate and photoinitiators for 20 minutes at high speed so that the temperature increased to 50° C. Then, the ink was passed over a three roll mill, 1 pass at 2 MPa (25° C.).

Table 4 below shows the composition of the finished ink (15% inert hard resin, 12% alkyd and 17.5% oil components):

TABLE 4

Example 5 Finished Ink

| Raw Materials | Weight % |
|---|---|
| Table 3 Color base | 60.00 |
| TMPTA (Allnex) | 27.00 |
| Irgacure 369 (BASF) | 2.5 |
| Omnirad EHA (IGM) | 6.00 |
| Omnirad 4-PBZ (IGM) | 3.50 |
| Omnirad OMBB (IGM) | 1.00 |
| Total | 100.00 |

The properties of Example 5 were tested as described above. The results are shown in Table 4A.

TABLE 4A

Properties of Example 5

| | Example 5 |
|---|---|
| Viscosity [Pa*s] @50 s−1 | 28.1 |
| Ink-O-meter @150 rpm [units] | 318 |
| Flow after 15 min. [cm] | 4.5 |
| Set-off test curing @ OD 1.61 | |
| after 100 mJ/cm$^2$ | 0.81 |
| after 500 mJ/cm$^2$ | 0.43 |
| after 1000 mJ/cm$^2$ | 0.10 |
| Lithography on lithotronic tester | Small change of torque during emulsification = good |
| Water-pick-up on lithotronic tester | 8.3 g |

No indication of the presence of scum or tinting of the emulsified ink was found. The torque values measured under emulsification were very similar compared to those from commercial inks from the Sun Chemical Sheet-fed ink product portfolio.

Example 6. Hybrid Ink Made from Color Base and then UV-Over-Coated (15% Inert Hard Resin)

A hybrid ink was made from a cyan universal base (color concentrate) which can be used to make sheet-fed inks, heat-set inks and cold-set inks and an acrylate let-down varnish by mixing in a dissolver at 40-45° C. for 20 minutes (about 50% combined inert hard resin & alkyd resin & vegetable oil & mineral oil).

TABLE 5

Example 6 finished ink formulation

| Raw Materials | Weight % |
|---|---|
| [7]MSB-17 cyan universal base (Sun Chemical) | 75.00 |
| [8]Acrylate let-down varnish* | 25.00 |
| Total | 100.00 |

[7]20% inert hard resin, 20% alkyd resin 25% vegetable and mineral oil and 25% pigment % pigment Sunfast blue
[8]Acrylate let down varnish: Trimethylolpropoane triacrylate (Allnex) 20.0%, Irgacure 369 (BASF) 1%, Omnirad ITX (IGM) 1%, Omnirad EHA (IGM) 2%, Omnirad PBz 1%

The properties of Example 6 were tested as described above. The results are shown in Table 5A.

TABLE 5A

Properties of Example 6

|  | Example 6 |
|---|---|
| Viscosity [Pa*s] @50 s$^{-1}$ | 35.1 |
| Tack-o-scope tack @150 rpm [units] | 280 |
| Flow after 15 min. [cm] | 5.5 |

The ink was printed with a Prufbrau print proofer at a density of 1.65 on Scheufelen BVS glossy paper (115 g/m$^2$).

The ink was in-line overprinted with UV-overprint varnish Solarclear 15HC144 (Sun Chemical) with an anilox roller @140 lines and end-cured with 150 mJ/cm$^2$. Gloss was measured as described above. Gloss back is indicated by a decrease in gloss over time. A decrease of less than 10 gloss units indicates that gloss back is within preferred ranges.

TABLE 6

Gloss Back Results

|  | Gloss Units |
|---|---|
| Gloss after UV-cure | 85.9 |
| Gloss after 1 day | 79.5 |
| Gloss after 3 days | 79.5 |

Table 6 exhibits the relatively low gloss back of the inks of the present invention. Note that the drop in gloss of 6.4 points is well within the preferred range of <10 points for a high gloss ink.

Example 7. Cyan Hybrid Ink Made from Conventional Sheetfed Ink and Acrylic Monomer with 20% Inert Hard Resin A hybrid ink as shown in Table 8 was made from a cyan conventional sheetfed ink and acrylic monomer with 20% inert hard resin (about 50% combined inert hard resin & alkyd resin & vegetable oil & mineral oil). The inert hard resin present in the ink is a rosin resin which is part of the formulation of the Titan Process Cyan TTN25 (see Table 8).

TABLE 8

Example 7

| Raw Materials | Weight % |
|---|---|
| Titan Process Cyan TTN25 (Sun Chemical) | 74.00 |
| TMPTA (Allnex) | 20.00 |
| Irgacure 369 (BASF) | 3.00 |
| Omnirad EMK (IGM) | 1.00 |
| Omnirad 481 (IGM) | 2.00 |
| Total | 100.00 |

The properties of Example 7 were tested as described above. The results are shown in Table 8A.

TABLE 8A

Properties of Example 7

|  | Example 7 |
|---|---|
| Viscosity [Pa*s] @50 s−1 | 28.1 |
| Tack-o-scope tack @150 rpm [units] | 250 |
| Flow after 15 min. [cm] | 1.5 |
| Set-off test curing @ OD 1.58 |  |
| after 100 mJ/cm$^2$ | 0.91 |
| after 500 mJ/cm$^2$ | 0.53 |
| after 1000 mJ/cm$^2$ | 0.20 |
| Lithography on lithotronic tester | Small change of torque during emulsification = good |
| Water-pick-up on lithotronic tester (g) | 11.3 |

No indication of the presence of scum or tinting of the emulsified ink was found. The torque values measured under emulsification were very similar compared to those from commercial inks from the Sun Chemical Sheet-fed ink product portfolio.

Example 8. Hybrid Ink Made from a Color Base with 23% Inert Hard Resin and a Dry Pigment A cyan hybrid inks was made from a color base and a dry pigment on a three roll mill, 1 pass at 2 MPa (25° C.), having the composition shown in Table 9 below (about 23% inert hard resin). The advantage is that the effective milling needs only one pass on the three roll mill, flow is increased and tack is reduced, compared to a similar ink having only dry cyan pigment. The properties of Example 8 were tested as described above, and the results are shown in Table 9A.

TABLE 9

Example 8

| Raw Materials | Weight % |
|---|---|
| FASTOGEN ® BLUE 15:3 pigment (Sun Chemical) | 10.30 |
| MSB17 BLUE BASE[1] (Sun Chemical) | 26.00 |
| TALC | 2.99 |
| IRGACURE 369 (BASF) | 0.50 |
| Polyetheracrylate (BASF) | 9.95 |
| TMPTA (Miwon) | 0.00 |
| DYNOADD F1 (Dynea) | 0.50 |
| FLORSTAB UV-1 (Kromachem) | 1.00 |
| GENOPOL BP-2 (Rahn) | 2.49 |
| OMNIRAD EHA (IGM) | 5.97 |
| OMNIRAD 4-PBZ (IGM) | 3.48 |

TABLE 9-continued

Example 8

| Raw Materials | Weight % |
| --- | --- |
| OMNIRAD OMBB (IGM) | 1.00 |
| VARNISH[2] | 35.82 |
| Total | 100 |

[1]20% inert hard resin, 20% alkyd resin, 30% vegetable and mineral oil and 30% pigment Sunfast blue
[2]50% Cyclohexanone-formaldehyde hard resin (Resine Italiane), 48.5% trimethylolpropoane triacrylate, 1.5% Genorad 16 (Rahn Group)

TABLE 9A

Properties of Examples 8

| | Example 8 |
| --- | --- |
| Viscosity (cone & plate) @50 s$^{-1}$ [Pas] | 30.21 |
| Tack 150 rpm @32° C. [units] | 226 |
| Flow @15 min. [cm] | 6.0 |
| Set-Off Curing Test [set-off density]: | |
| 33 mJ/cm$^2$ | 0.53 |
| 66 mJ/cm$^2$ | 0.29 |
| 100 mJ/cm$^2$ | 0.07 |
| 133 mJ/cm$^2$ | 0.03 |

Example 9. Cyan Hybrid Coldset Ink

The experimental ink from example 9 was printed with a "Prufbau" print proofer on the newspaper substrate Stora-Enso Newspress (weight: 45 g/m2) at an optical density of 1.0 (measured with a Gretag densitometer). Then, the ink was cured with a UV-bulb (Fusion H bulb having a power of 240 W/cm) with different UV-doses from 33-133 mJ/cm$^2$. The curing of the ink was compared with a standard UV-coldset ink, derived from a diluted Sun Chemical Laser ink series having less than about 4 weight % of inert resin materials. The formulation and the results are shown in Table 10. Despite the much higher level of inert resin in the experimental ink, no difference in drying speed vs. the standard was observed on newspaper substrate, measured with the set-off curing test.

TABLE 10

Cyan hybrid coldset ink

| Description | Experimental ink [Weight %] |
| --- | --- |
| FASTOGEN ® BLUE 15:3 pigment (Sun Chemical) | 9.35 |
| BLUE BASE [1] | 25.00 |
| TALC | 3.00 |
| IRGACURE 369 (BASF) | 0.50 |
| Polyether acrylate (BASF) | 11.50 |
| TMPTA (Miwon) | 6.15 |
| DYNOADD F1 (Dynea) | 0.50 |
| FLORSTAB UV-1 (Kromachem) | 1.00 |
| GENOPOL BP-2 (Rahn) | 2.50 |
| OMNIRAD EHA (IGM) | 6.00 |
| OMNIRAD 4-PBZ (IGM) | 3.50 |
| OMNIRAD OMBB (IGM) | 1.00 |
| VARNISH[2] | 30.00 |
| Total | 100.00 |

[1]20% inert rosin resin, 22% alkyd resin, 30% vegetable and mineral oil and 28% pigment Sunfast blue
[2]50% maleic rosin resin (acid value: 35) 48.5% trimethylolpropane triacrylate, 1.5% Genorad 18 (Rahn Group)

TABLE 10A

Properties of Experimental Cyan Coldset Ink and Standard Ink

| | Experimental ink | Standard ink |
| --- | --- | --- |
| Viscosity (cone & plate) @50 s$^{-1}$ [Pas] | 19.21 | 16.82 |
| Tack 150 rpm @32° C. [units] | 189 | 175 |
| Flow @15 min. [cm] | 6.0 | 6.5 |
| Set-Off Curing Test [set-off density]: | | |
| 33 mJ/cm$^2$ | 0.24 | 0.29 |
| 66 mJ/cm$^2$ | 0.12 | 0.19 |
| 100 mJ/cm$^2$ | 0.06 | 0.05 |
| 133 mJ/cm$^2$ | 0.04 | 0.01 |

The present invention has been described in detail, including the preferred embodiments thereof. However, it will be appreciated that those skilled in the art, upon consideration of the present disclosure, may make modifications and/or improvements on this invention that fall within the scope and spirit of the invention.

The invention claimed is:

1. A lithographic radiation curable hybrid ink or coating composition comprising:
   a) 10 wt % to 30 wt % one or more inert hard resins selected from the group consisting of rosin resins, rosin resin derivatives, hydrocarbon resins, modified hydrocarbon resins, and combinations thereof; and
   b) 5 wt % to 45 wt % one or more multifunctional acrylate monomers;
   wherein at least one of the inert hard resins has a cloud point greater than 100° C. in a concentration of 10% by weight in a test oil with a boiling point of 260° C. to 290° C.; and
   wherein the ink or coating composition is curable by actinic radiation.

2. The lithographic radiation curable hybrid ink or coating composition of claim 1, wherein the one or more inert hard resins are selected from the group consisting of maleic rosin resins, aromatic hydrocarbon resins, and combinations thereof.

3. The lithographic radiation curable hybrid ink or coating composition of claim 1, having one or more of the following:
   a) wherein at least one of the inert hard resins is a maleic rosin resin which is soluble in acrylate monomers;
   b) wherein at least one of the inert hard resins has a softening point greater than 100° C.; or
   c) wherein at least one of the inert hard resins is an aromatic hydrocarbon resin having a softening point greater than 100° C.

4. The lithographic radiation curable hybrid ink or coating composition of claim 3, wherein the aromatic hydrocarbon resin is a $C_9$ aromatic hydrocarbon.

5. The lithographic radiation curable hybrid ink or coating composition of claim 1, having one or more of the following:
   a) wherein at least one of the inert hard resins has an acid value of 10 to 40 mg KOH/g;
   b) wherein at least one of the inert hard resins is a maleic rosin resin, or mixture thereof, having a softening point greater than 100° C. and an acid value of 10 to 40 mg KOH/g; or
   c) wherein at least one inert hard resin has a softening point greater than 100° C., a cloud point greater than 100° C. in a concentration of 10% by weight in a test oil with a boiling point of 260° C. to 290° C., and an acid value of 10 to 40 mg KOH/g.

6. The lithographic radiation curable hybrid ink or coating composition of claim 1, wherein the one or more inert hard resins are compatible, soluble, or compatible and soluble, with acrylate monomers and oligomers, oils, and alkyd resins.

7. The lithographic radiation curable hybrid ink or coating composition of claim 1, further comprising one or more resins selected from the group consisting of oil-modified phenolic resins, ketone resins, aldehyde-urea resins, oil modified polyester resins, melamine resins, epoxy resins, polyurethane resins, acrylic styrene resins, and combinations thereof.

8. The lithographic radiation curable hybrid ink or coating composition of claim 1, wherein the one or more multifunctional acrylate monomers are selected from the group consisting of 1,2-ethylene glycol diacrylate, 1,4-butandiol diacrylate, 1,6-hexandiol diacrylate, dipropylene glycol diacrylate, neopentylglycol diacrylate, ethoxylated neopentylglycol diacrylates, propoxylated neopentylglycol diacrylates, tripropylene glycol diacrylate, bisphenol-A diacrylate, ethoxylated bisphenol-A-diacrylates, bisphenol-A-diglycidylether diacrylate, ethoxylated bisphenol-A-diacrylates, poly(ethylene)glycol diacrylates, trimethylolpropane triacrylate, trimethylolpropane trimethacrylate, ethoxylated trimethylolpropane triacrylates, propoxylated trimethylolpropane triacrylates, propoxylated glycerol triacrylates, pentaerythritol triacrylate, ethoxylated pentaerythritol triacrylates, propoxylated pentaerythritol tetraacrylates, ethoxylated pentaerythritol tetraacrylates, ditrimethylolpropane tetraacrylate, dipentaerythritol pentaacrylate, dipentaerythritol hexaacrylate, ethoxylated dipentaerythritol hexaacrylates, and combinations thereof.

9. The lithographic radiation curable hybrid ink or coating composition of claim 1, further comprising one or more of the following:
   a) 0.1 wt % to 25 wt % one or more oils, alkyd resins, or combinations thereof;
   b) 0.1 wt % to 20 wt % one or more acrylate oligomers;
   c) 0.1 wt % to 10 wt % one or more monofunctional acrylate monomers
   d) 0.1 wt % to 40 wt % of one or more colorants;
   e) 0.1 wt % to 10 wt % of one or more extenders or fillers;
   f) 0.1 wt % to 20 wt % of one or more photoinitiators;
   g) 0.1 wt % to 3 wt % of one or more dryers; or
   h) 0.1 wt % to 4 wt % one or more additives.

10. The lithographic radiation curable hybrid ink or coating composition of claim 9, wherein the one or more oils are selected from the group consisting of hydrocarbon oils, vegetable oils, fatty acid alkylesters, or combinations thereof.

11. The lithographic radiation curable hybrid ink or coating composition of claim 10, wherein the one or more vegetable oils are selected from the group consisting of drying oils, semi-drying oils, non-drying oils, and combinations thereof.

12. The lithographic radiation curable hybrid ink or coating composition of claim 9 wherein each of the one or more acrylate oligomers independently has a number average molecular weight of 400 to 3,000 Daltons, and an acrylate functionality equal to or greater than 2.

13. The lithographic radiation curable hybrid ink or coating composition of claim 9, wherein the one or more acrylate oligomers are chosen from the group consisting of acrylated oils, epoxy acrylates, oil modified polyester acrylates, acrylated polyurethanes, acrylated polyacrylates, acrylated polyethers, acrylated amines, and combinations thereof.

14. The lithographic radiation curable hybrid ink or coating composition of claim 9, wherein the one or more colorants are chosen from the group consisting of inorganic pigments, organic pigments, dyes, and combinations thereof.

15. The lithographic radiation curable hybrid ink or coating composition of claim 9, wherein the one or more extenders or fillers are chosen from the group consisting of clay, talc, calcium carbonate, magnesium carbonate, silica, and combinations thereof.

16. The lithographic radiation curable hybrid ink or coating composition of claim 9, wherein the one or more photoinitiators are chosen from the group consisting of oligomeric photoinitiators, polymeric photoinitiators, and combinations thereof.

17. The lithographic radiation curable hybrid ink or coating composition of claim 9, wherein at least one of the photoinitiators is an oligomeric benzophenone derivative.

18. The lithographic radiation curable hybrid ink or coating composition of claim 9, wherein the one or more dryers are each independently selected from the group consisting of fatty acid salts, heavy metal salts of organic carboxylic acid, and combinations thereof.

19. The lithographic radiation curable hybrid ink or coating composition of claim 9, wherein the one or more additives are selected from the group consisting of surface active agents, dispersants, de-aerators, waxes, shelf-life stabilizers, wetting agents, slip agents, flow agents, fluorocarbon surfactants, silicones, organic polymeric surfactants, or combinations thereof.

20. A method of printing an article comprising applying the lithographic radiation curable hybrid ink or coating composition of claim 1 as a UV-coldset lithographic ink, or as a UV-heatset lithographic ink.

21. A printed article comprising the lithographic radiation curable hybrid ink or coating composition of claim 1.

* * * * *